US 6,655,983 B1

(12) United States Patent
Ishikawa et al.

(10) Patent No.: US 6,655,983 B1
(45) Date of Patent: Dec. 2, 2003

(54) ELECTRICAL TEST PROBE PROVIDED WITH A SIGNAL TRANSMITTING WIRE HAVING AN ENLARGED PORTION FOR PREVENTING THE WIRE FROM COMING OUT OF THE PROBE

(75) Inventors: Shigeki Ishikawa, Nagano (JP); Yoshio Yamada, Nagano (JP)

(73) Assignee: NHK Spring Co., Ltd. (JP)

( * ) Notice: Subject to any disclaimer, the term of this patent is extended or adjusted under 35 U.S.C. 154(b) by 0 days.

(21) Appl. No.: 09/979,669
(22) PCT Filed: May 26, 2000
(86) PCT No.: PCT/JP00/03414
§ 371 (c)(1), (2), (4) Date: Nov. 26, 2001
(87) PCT Pub. No.: WO00/73805
PCT Pub. Date: Jul. 12, 2000

(30) Foreign Application Priority Data

May 28, 1999 (JP) ............................. 11-149383

(51) Int. Cl.[7] ...................... H01R 11/18; H01R 13/00; G01R 31/02
(52) U.S. Cl. ...................................... 439/482; 324/754
(58) Field of Search ........................ 439/482, 700; 324/754, 757, 758

(56) References Cited

U.S. PATENT DOCUMENTS 4,454,473 A * 6/1984 Rosauer ................ 324/262
6,337,572 B1 * 1/2002 Kazama ................ 324/754

FOREIGN PATENT DOCUMENTS

| JP | 3-29388 | 2/1991 |
| JP | 6-180328 | 6/1994 |
| JP | 6-317624 | 11/1994 |
| JP | 9-72932 | 3/1997 |
| JP | 10-19930 | 1/1998 |

* cited by examiner

Primary Examiner—Chandrika Prasad
(74) Attorney, Agent, or Firm—Lowe Hauptman Gilman & Berner, LLP

(57) ABSTRACT

In order to make a conductive contact that is appropriate for fine pitching, without using a lead wire whose diameter is needlessly thin, a compressed coil spring 5 and the shells 6a and 7a of needle-like elements 6 and 7 that are connected to the two ends of the coil are accepted into a through hole 3a in an intermediate-layer member 3 that is laminated with three layers in an axial direction. A holding hole 8a is formed in a wiring plate 8 that is laminated on the top face of an upper-layer member 4, and an approximately circular flat part 9a that is formed at the end of a signal-transmitting lead wire 9 is accepted in the holding hole 8a of the wiring plate 8, and extraction of the flat part 9a from the holding hole 8a is prevented by making the lead-wire insertion hole 8b narrower in diameter than the holding hole 8a. Extraction of the flat part 9a can be prevented by simple processing such that a flat-formed part is formed at one end of the signal-transmitting lead wire 9 that connects with an outside circuit 10. In addition, the signal-transmitting lead wire 9 does not have to be needlessly thin (i.e., it can be as thick as is necessary to transmit the signal), because a pipe-shaped connector does not need to be used, and that prevents an increase in the lead-wire resistance and makes possible fine pitching.

18 Claims, 9 Drawing Sheets

ELECTRICAL TEST PROBE PROVIDED WITH A SIGNAL TRANSMITTING WIRE HAVING AN ENLARGED PORTION FOR PREVENTING THE WIRE FROM COMING OUT OF THE PROBE

FIELD OF THE INVENTION

This invention relates to an electrical test probe having a signal-transmitting wire that transmits to an outside circuit the electrical signals that are retrieved by bringing a protruded end of the needle-like element into contact with a specified material

BACKGROUND OF THE INVENTION

A conventional electrical test probe that is used as a contact probe for performing an electrical check of a conductor pattern or an electronic element and the like of a printed circuit board, has a conductive needle-like element and a holder that supports the needle-like element so that the element protrudes in an axial-line direction, and is such that a protruded end of the needle-like element is elastically energized by a coil spring in an axial direction so as to project the protruded end from the front end of the holder so that the protruded end is elastically brought into contact with a material or object to be checked, i.e., a contacted material.

Recently, (1) a fine pitch has been realized for a substrate for mounting semiconductor chips or TAB as objects to be electrically checked by using such a conductive needle-like element, (2) the processing velocity has been fixed, and (3) the chips have been miniaturized and thinned. When an object is electrically checked, it is necessary that electrical test probes, which are installed so as to correspond to each electrode (leads of a land and TAB) as a contacted material arranged at a fine pitch, are brought into contact with the object in their respective order.

For the purpose of coping with the above-mentioned fine-pitched materials, the pitch between the electrical test probes are narrowed; for example, a pitch of from 0.15 mm to 0.2 mm has been required. Also, for transmitting electrical signals from the electrical test probes to an outside circuit, a lead wire must be installed as a signal-transmitting wire, but it is difficult for the lead wires to be arranged so as not to cause interference between the adjacent wires for each electrical test probe under the above-mentioned condition that the contacts are arranged at a pitch of 0.2 mm or less.

For example, a conventional lead-wire attaching structure in an electrical test probe is shown in FIG. 6. As shown in FIG. 6, a diameter-enlarged shell 21a of a conductive needle-like element 21 and a compressed coil spring 22 for elastically energizing a needle 21b in a protruding direction (the lower portion of FIG. 6) are coaxially accepted in a through hole 23a within an intermediate-layer member 23. The upper- and lower-layer members 24 and 25 are then laminated in such a way so as to sandwich the intermediate-layer member 23 between them. The lower-layer member 25 contains a hole 25a, which has a diameter that is large enough to accept the needle 21b of the needle-like element 21 and small enough to prevent extraction of the needle-like element 21, because the bottom of the shell 21a is brought into contact with the lower-layer member 25. In addition, the upper-layer member 24 contains a hole 24a that is small enough in diameter to accept the lead wire 27, which is connected to the needle-like element 21 via a pipe-shaped connector 26 in the through hole 23a, and that is large enough so as to prevent extraction of the coil spring 22.

As shown in FIG. 7, the needle-like elements 21 and 28 are respectively coupled to each end of the coil spring 22, and the shells 21a and 28a are elastically energized in a manner so as to protrude the needles 21b and 28b of the needle-like elements 21 and 28 in opposite directions. The needle 28b of the needle-like element 28, which protrudes in a direction opposite to that of the needle-like element 21 that is to be contacted with the contacted material, protrudes upward via the small-diameter hole 24a of the upper-layer member 24 in such a manner as to be inserted into and elastically contacted with the pipe-shaped connector 26 that is mounted in a wiring plate 29 which is laminated on the top face of the upper-layer member 24.

SUMMARY OF THE INVENTION

However, as shown in FIG. 8, when a lead wire 27 is composed of a coated wire, each of the above-mentioned connectors is formed in a pipe shape having a hole 26a into which a core wire 27a can be inserted. The pipe-shaped connector 26 is used for facilitating a connection to the lead wire 27. When the outside diameter of the pipe-shaped connector 26 is 0.11 mm or less, so as to correspond to the above-mentioned pitch of 0.15 mm or less, it must have a wall thickness of 0.04, and the inside diameter of the pipe hole is approximately 0.07 mm. Thus, the diameter of the core wire 27a that is to be inserted into the hole 26a is approximately 0.07 mm.

However, an easy-to-get conductive wire suitable for the lead wire 27 is not suitable for use as a wiring material for an electrical checking probe, because the resistance of the above-mentioned wire with a diameter of approximately 0.07 mm is 2Ψ or more at a length of 300 mm. If a special low-resistance wire material is used, the problem is that the parts are more expensive.

For the purpose of solving the above problems and realizing an electrical test probe that is capable of the desired fine pitch without narrowing the diameter of the lead wire extremely, the electrical test probe of the present invention has multiple conductive needle-like elements that are wound in a spiral manner and are parallel to each other, a holder for supporting the needle-like element so that the element protrudes in an axial-line direction, and signal-transmitting wires, one of which is provided to each of said plural needle-like elements, for transmitting to an outside circuit the electrical signals that are retrieved by bringing the protruded end of the needle-like element into contact with the contacted material. The signal-transmitting wire is composed of a single wire, and a flat part is formed at one portion of the end on the electric-signals-input side of each signal-transmitting wire, and said flat part is directly accepted in said holder. Also, the end of the holder is open at a size that allows the signal-transmitting wire to pass but that prevents the flat portion of the wire to be extracted from the holder.

With this invention, the signal-transmitting wire can be affixed to the holder end simply by only forming one end of the signal-transmitting wire, which is composed of a single wire, as a flat portion. As a result, a pipe-like connector does not need to be used. Also, because the signal-transmitting wire does not have to be thinner than is necessary for it to be inserted into the hole of the pipe-shaped connector, whose diameter is narrowed as necessary to achieve fine pitching, it is possible both to prevent the increase of conductive-wire resistance that results when the diameter of the signal-transmitting wire is made smaller, and to realize fine pitching.

In particular, it is preferable that the end of the holder is formed of a member that contains a stepped diameter axial-line through hole, with the larger-diameter portion being large enough to directly accept the flat portion of the signal-transmitting wire and the smaller-diameter portion being large enough to pass the wire but small enough to prevent extraction of the flat portion of the wire. As a result, because the flat portion is accepted by the bore-processed member and is prevented from being extracted, the holder end that prevents extraction can be easily processed and attached.

Or, it is preferable that the end of the holder is formed in a manner so as to laminate (1) a first laminar element that contains an axial-line through hole whose diameter is large enough to directly accept the flat portion of the signal-transmitting wire, and (2) a second laminar element that contains an axial-line through hole, whose diameter is large enough to pass the signal-transmitting wire but small enough to prevent extraction of the flat portion of the wire. Because the hole for accepting the flat portion and the hole for preventing extraction are in separate laminar elements, each bore-processing procedure can be easily applied.

DESCRIPTION OF THE PREFERRED EMBODIMENTS

Embodiments of the present invention are described in detail below, with reference to the examples shown in the accompanying drawings.

Figure 1:
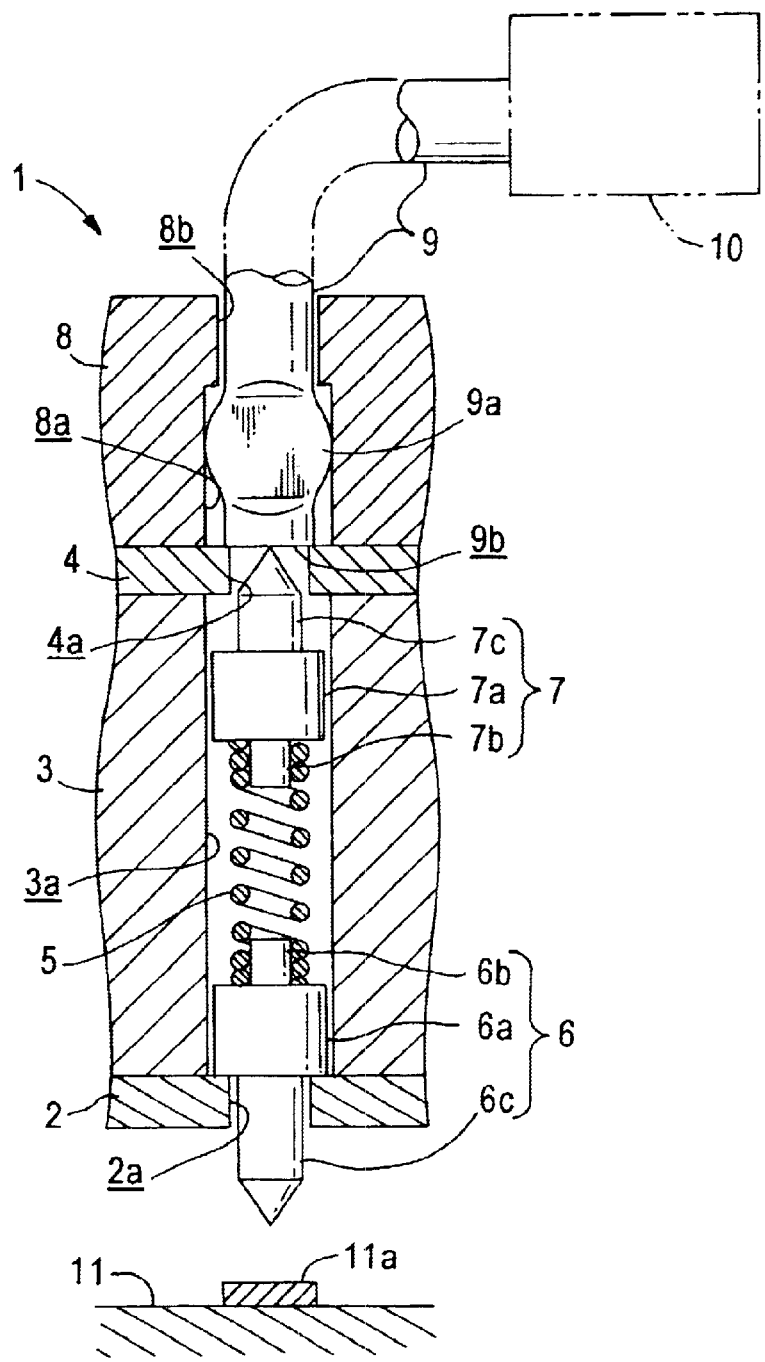
FIG. 1 is a longitudinal cross-sectional view of the main part, showing an electrical test probe in a probe unit, to which the present invention is applied.
Figure 9:
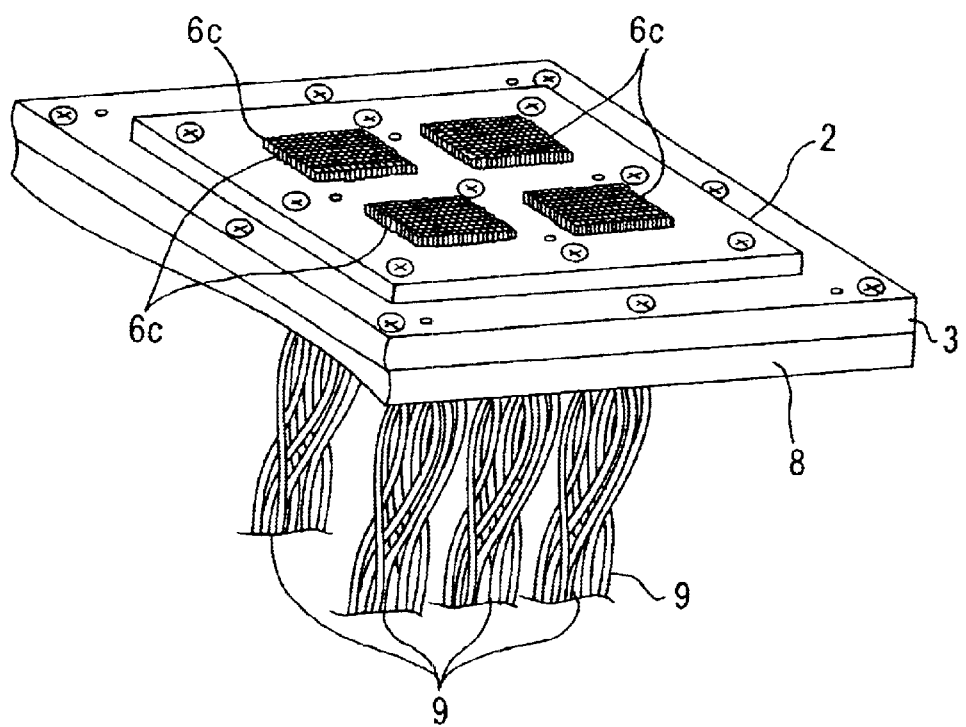
FIG. 9 is a perspective view of a contact probe arrangement using a plurality of the probes according to the present invention with the probes being arranged in parallel at a given pitch in both the horizontal and vertical directions.
Figure 10:
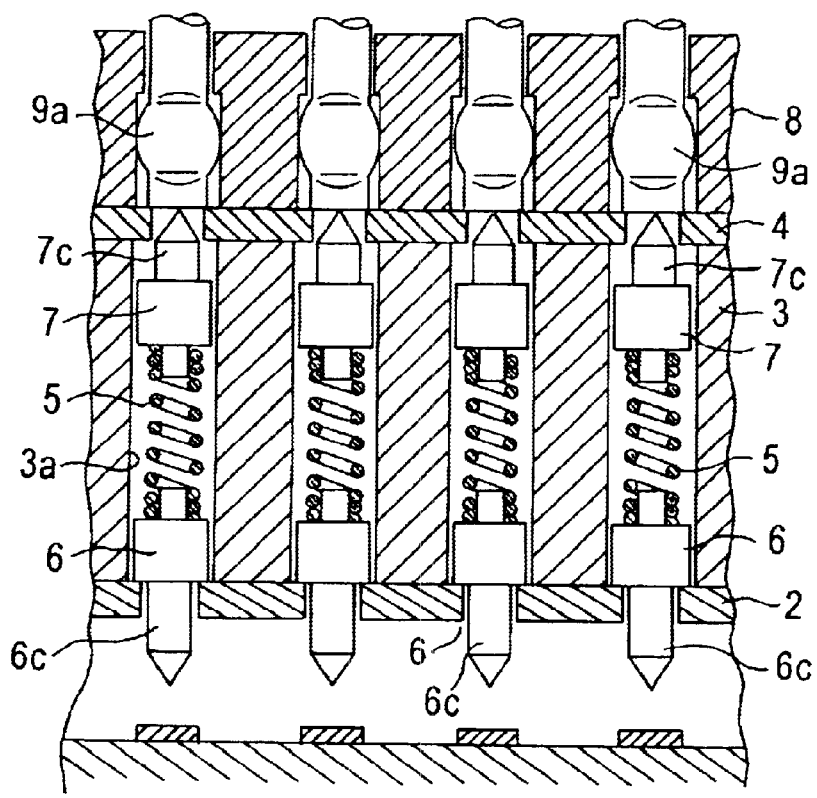
FIG. 10 is a cross sectional view showing a series of the probes of the present invention being arranged in parallel at a given pitch.

FIG. 1 is a longitudinal cross-sectional view of the main part, showing an electrical test probe 1 in a probe unit to which the present invention is applied. In addition, the present invention is suitable for a probe unit wherein plural electrical test probes 1 are arranged in parallel at a given pitch in both the horizontal and vertical directions, as shown in FIGS. 9–10.

As shown in FIG. 1, a lower-layer member 2, an intermediate-layer member 3, and an upper-layer member 4 are sequentially laminated, and the intermediate-layer member 3 contains a through hole 3a in its thickness (axial) direction. A conductive compressed coil spring 5, and a pair of conductive needle-like elements 6 and 7 are accepted in the through hole 3a coaxially and reciprocally in an axial-line direction.

The conductive needle-like elements 6 and 7 comprise (1) diameter-enlarged shells 6a and 7a that are formed at a diameter such as to be movable while being guided in the through hole 3a, (2) connecting bosses 6b and 7b that protrude from the shells 6a and 7a, respectively, at a diameter that is capable of winding the coil end of the compressed coil spring 5, and (3) needles 6c and 7c that are connected to the diameter-enlarged shells 6a and 7a in such a manner so as to protrude towards the opposite side of the connecting bosses 6b and 7b. The lower-layer member 2 contains a needle insertion hole 2a whose diameter is larger than the checking needle 6c of the conductive needle-like element 6 but is smaller than that of the shell 6a, and the needle 6c protrudes outward from the lower-layer member 3 via the needle insertion hole 2a.

Also, the upper-layer member 4 contains a needle insertion hole 4a, which has a dimension appropriate for inserting the needle 7c of the conductive needle-like element 7 while preventing the shell 7a from being extracted, and the needle 7c projects into the needle insertion hole 4a. The holes 2a, 3a, and 4a pass through the three members 2, 3, and 4 respectively, which together constitute the main part of the holder.

Figure 2:
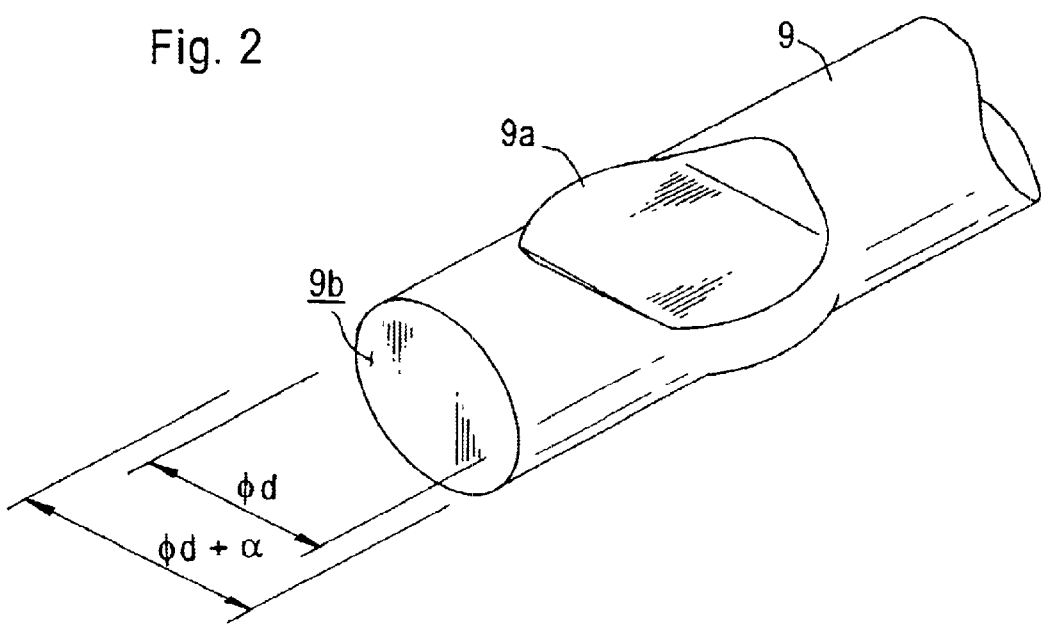
FIG. 2 is an enlarged-perspective view that shows the shapes of the ends of a lead wire.

A wiring plate 8, which is laminated on the top face of the upper-layer member 4 as one end of the holder, includes a holding hole 8a that is above and larger in diameter than the needle insertion hole 4a and that has a specified longitudinal depth. An approximately circular flat part 9a, which is formed at the end of the lead wire 9, which comprises a single wire such as an enamel wire, is accepted in the holding hole 8a as a signal-transmitting wire. As shown in FIG. 2, the flat part 9a can be obtained by plastic-deforming the end of the lead wire 9 by press processing in a direction perpendicular to an axial line. The flat part 9a is thereby formed in an approximately circular shape whose diameter is larger (d+α) than the outside diameter d of the lead wire 9 (the outside diameter of the enamel wire), as shown in FIG. 2.

Also, the lead wire 9 extends outward via the lead-wire insertion hole 8b, which extends through the wiring plate 8 so as to connect at the lower end to the holding hole 8a, and which has a diameter that is smaller than that of the holding hole 8a, and which is connected at its upper end to an outside circuit 10, which can be a measuring apparatus. The lead-wire insertion hole 8b has a diameter that is large enough so that the lead wire 9 can be inserted at its upper end and is small enough to prevent the flat part 9a from being extracted from the holding hole 8a. Thus, the flat part 9a that is in the holding hole 8a is prevented from being extracted in the direction of the lead wire 9 by means of a step between the holding hole 8a and the lead-wire insertion hole 8b.

The axial-line-direction end face 9b of the lead wire 9 is in a condition such that the flat part 9a is in the holding hole 8a and is positioned so as to face towards the needle insertion hole 4a from the holding hole 8a, in such a way that the needle 7c of the needle-like element 7 elastically abuts the end face 9b.

The probe unit wherein a plural number of the thus constituted electrical test probes are arranged in parallel at a given pitch in horizontal and vertical directions is made so that it can move towards an object to be checked, for example, a substrate 11 for mounting semiconductor chips, whereby the protruding end of the needle 6c of the bottom-side needle-like element 6, which serves as a checking needle, elastically abuts an electrode 11a as a contacted material. The electrical signal that is retrieved at the needle-like element 6 is transmitted therefrom via the conductive coil spring 5 to the top-side needle-like element 7, from which the signal is transmitted to the end face 9b, which is one end of the signal-transmitting wire-lead wire 9, by which the signal is transmitted to the outside circuit 10.

Because such a conductive needle-like element does not require the use of the narrow-diameter lead wire that is inserted in the narrow-diameter pipe when a pipe-shaped connector as shown in a conventional example is used, the lead wire 9 does not have to be needlessly thin. Thus, a lead wire of 0.08 mm or more in diameter can be used instead of a lead wire of less than 0.08 in diameter to achieve a lead-wire resistance of 2ø or more. For example, in the case of a lead wire of 0.08 mm–0.09 mm in diameter, the width (d+α) of the flat part 9a is approximately 0.10 mm–0.11 mm. Therefore, if the pitch becomes 0.15 mm or so due to fine pitching, the holding hole 8a can be formed without there being any interference between the adjacent contacts.

It is desired that the flat part 9a be within the holding hole 8a and be fastened to the wiring plate 8 in such a way that the flat part 9a does not move, although it can be affixed by an adhesive. Also, even if, due to processing error, the flat part 9a moves slightly in the holding hole 8a, a contact condition is secured because the needle-like element 7 is elastically energized, and, as a result, no problem occurs.

Figure 3:
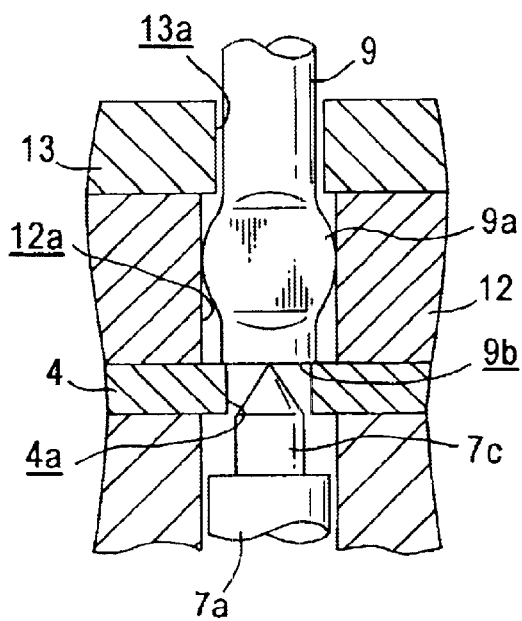
FIG. 3 is a longitudinal cross-sectional view of the main part, showing the second embodiment of a wiring plate.

In addition, in the above-mentioned embodiment, the holding hole 8a and the lead-wire insertion hole 8b are formed in one wiring plate 8 in a stepped-hole shape. However, as shown in FIG. 3, two plates 12 and 13 can be laminated on the upper-layer member 4 as the first laminar element and second laminar element, respectively; the bottom side plate 12 can contain a large-diameter through hole 12a corresponding to the holding hole 8a; and the top side plate 13 can contain a lead-wire insertion hole 13a as a small-diameter through hole corresponding to the lead-wire insertion hole 8b. In such a case, the effect is similar to the above-mentioned embodiment, and processing is easy because each plate can be bored by one processing step only.

Figure 4:
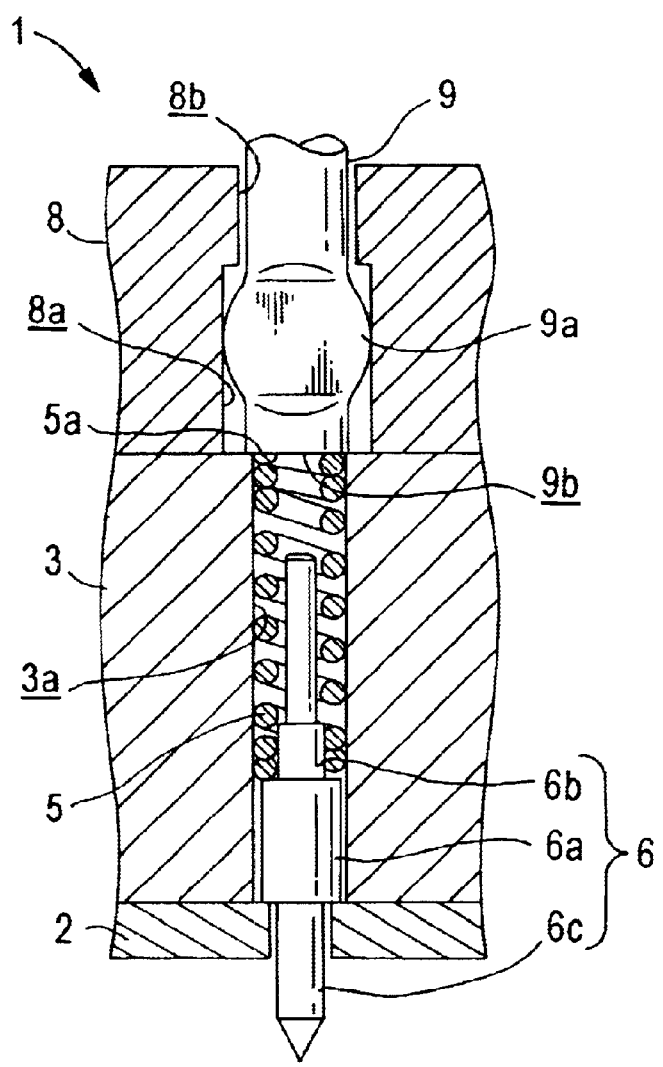
FIG. 4 is a longitudinal cross-sectional view corresponding to FIG. 1, but showing a single-needle movable needle-like element instead of a double-needle element.

In the above-mentioned embodiment, the electrical test probe has a structure such that both of the needle-like elements 6 and 7 are movable and are respectively installed at the two ends of the compressed coil spring 5. However, the electrical test probe can have a structure so as to include a single-needle movable needle-like element, one example of which is shown in FIG. 4. However, in order to avoid an excessively detailed description in such a case, the parts that correspond to those of the above-mentioned embodiment have same numbers as they do for the above-mentioned embodiment.

In FIG. 4, the needle-like element 6 is connected to only one end of the compressed coil spring 5, and the other end 5a directly abuts the end face 9b of the lead wire 9. With the present invention, even in such a case there can be applied an end face having the same shape as the end face of the lead wire of the present invention, and the effects achieved will be identical to those of the above-mentioned embodiment. Also, the shape of the coil end for abutting the end face 9b of the lead wire 9 is not limited to the above-mentioned straight shape; it can be a conical winding shape such that the abutting end is its tip, or the top of the conical shape can abut the end face 9b of the lead wire 9.

Figure 5:
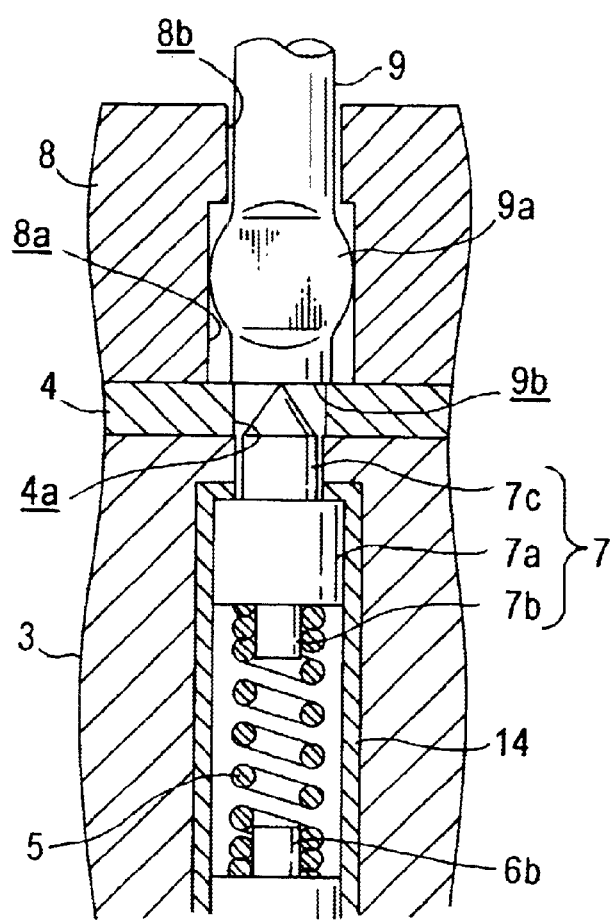
FIG. 5 is a longitudinal cross-sectional view of the main part, showing an electrical test probe using a pipe element.
Figure 6:
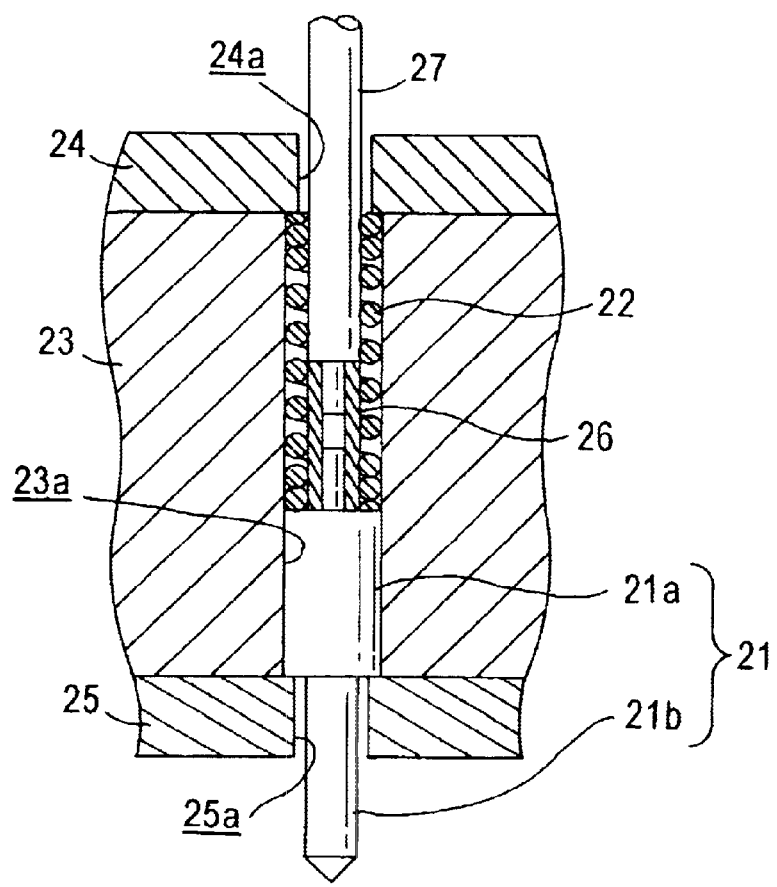
FIG. 6 is a main part cross sectional and broken view showing one embodiment of a conventional electrical test probe.
Figure 7:
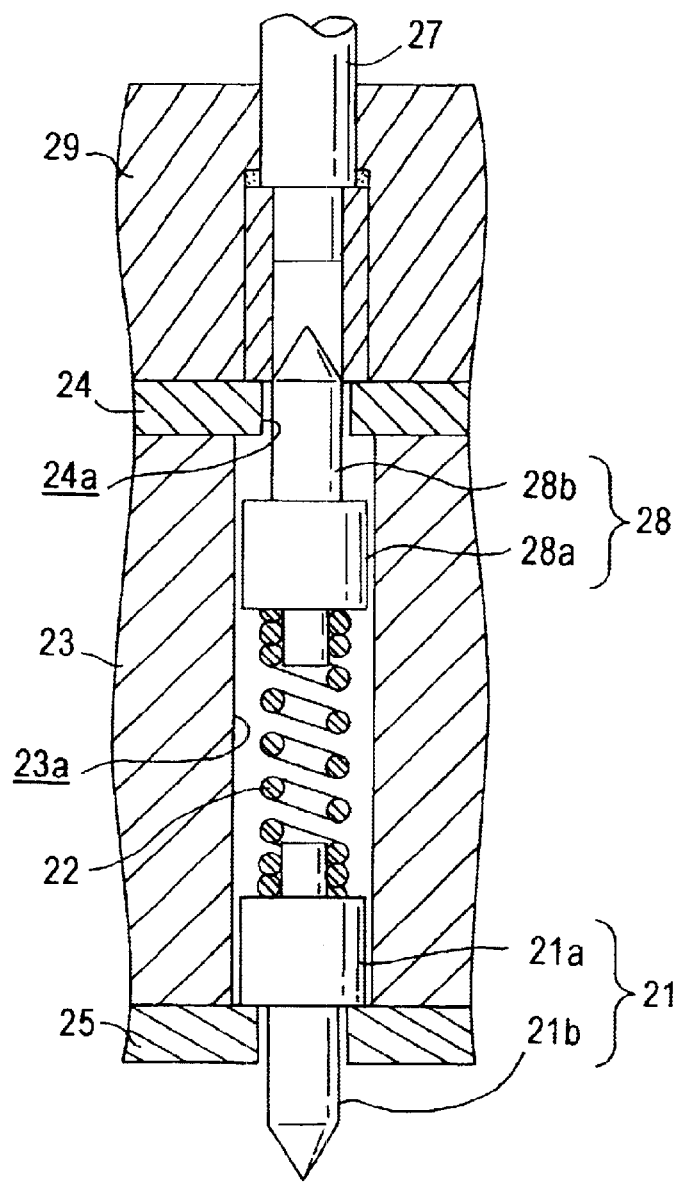
FIG. 7 is a longitudinal cross-sectional view of the main part, showing another embodiment of a conventional electrical test probe.
Figure 8:
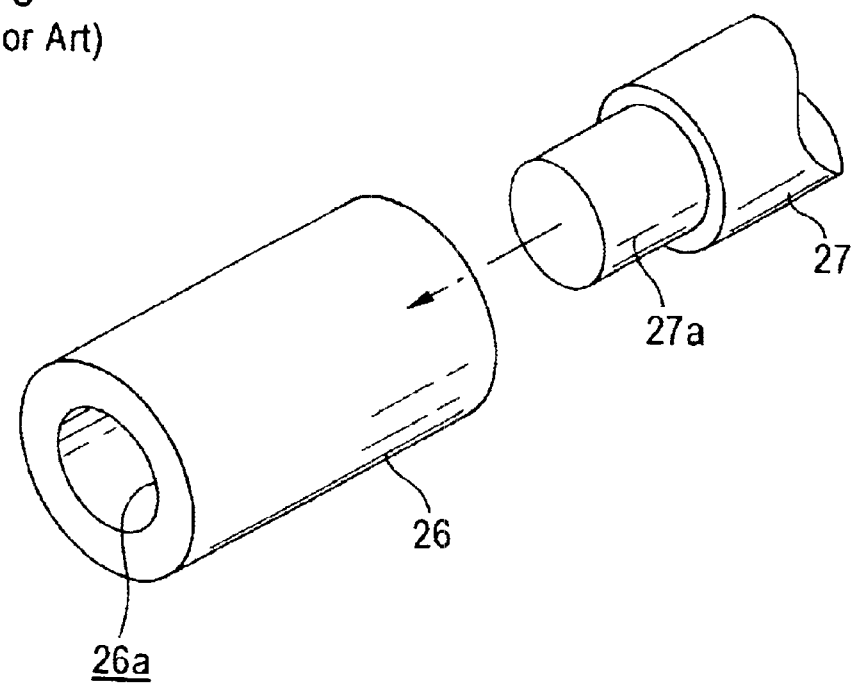
FIG. 8 is an enlarged-perspective view that shows a connector for connecting a lead wire used for a conventional electrical test probe.

This invention can be applied as an electrical test probe wherein the holder is formed of a pipe element, one example of which is shown in FIG. 5. Once again, in order to avoid an excessively detailed description, the parts that correspond to those of the above-mentioned embodiment have the same numbers as they do for the above-mentioned embodiment.

In FIG. 5, a pipe element 14 is contained within the intermediate-layer member 3, and the compressed coil spring 5 and both of the conductive needle-like elements 6 and 7 are accepted in the pipe element 14. An inward flange part is formed in such a way that both axial-line-direction ends of the pipe element 14 are bent inward in a radial direction so as to prevent both of the conductive needle-like elements 6 and 7 from being extracted. Such a constituted electrical test probe can achieve effects similar to those described above, and its handling properties can be improved before the compressed coil spring 5 and the conductive needle-like elements 6 and 7 are attached to the intermediate-layer member 3.

POSSIBILITY OF INDUSTRIAL UTILIZATION

As mentioned above, with the present invention the signal-transmitting wire can be prevented from being extracted by a simple processing such that a flat part is formed at one end of the signal-transmitting wire, which is composed of a single wire. In that way, an increase in the resistance of the lead-wire can be prevented, and a fine pitch can be realized because the signal-transmitting wire does not have to be thinner than is required to transmit the signals, because there is no need to use a pipe-shaped connector.

In particular, the holder end can be easily processed, or assembled from parts, such that the end of the holder is formed of a member that contains a stepped-diameter axial-line through hole, with the larger-diameter portion being large enough to accept the flat portion of the signal-transmitting wire and the smaller-diameter portion being large enough to pass the wire but small-enough to prevent extraction of the flat portion of the wire or, a holder end for preventing extraction can be formed such that each laminar element contains a separate hole, so that bore-processing can be easily performed.

What is claimed is:

1. An electrical test probe comprising:
    a plurality of conductive needle-like elements which are arranged along a plurality of rows that are perpendicular to the needle-like elements;
    a wiring plate supporting the needle-like elements that protrude in an axial direction; and
    signal-transmitting wires each of which is provided to one of said plural needle-like elements for transmitting to an outside circuit an electrical signal that is retrieved by bringing a protruded end of the needle-like element into contact with a device to be tested;
    wherein
    (a) each of said signal-transmitting wires is a single wire with a circular cross section;
    (b) each of said signal-transmitting wires has an end at an electrical-signal-input side thereof, wherein said end is circular in cross section and by said end the electrical-signal-input side is brought into contact with the associated conductive needle-like element;
    (c) each of said signal-transmitting wires has a flat portion which protrudes in a diametrical direction of said signal-transmitting wire and is formed on the wire at a portion that is spaced from said end of the electrical-signal-input side;

(d) said flat portion is directly accepted in said wiring plate; and (e) an end of said wiring plate is open at a diameter large enough to allow the signal-transmitting wire to pass through but small enough to prevent extraction of the flat portion thereof.

2. An electrical test probe as defined in claim 1, wherein the end of the wiring plate comprises a member that has an axial hole that has a stepped diameter, a lower portion of said hole is large enough in diameter to directly accept the flat portion of the signal-transmitting wire, and an upper portion of said hole is large enough in diameter to allow the signal-transmitting wire to pass through but small enough in diameter to prevent extraction of the flat portion of the wire.

3. An electrical test probe as defined in claim 1, wherein the end of the wiring plate is formed by laminating (1) a first laminar element that includes an axial hole that has a stepped diameter with a lower diameter being large enough to directly accept the flat portion of the signal-transmitting wire and an upper diameter being small enough to allow the signal-transmitting wire to pass through but large enough to prevent extraction of the flat portion of the wire, and (2) and a second laminar element that includes another axial hole that is large enough in diameter to allow the signal-transmitting wire to pass but small enough in diameter to prevent extraction of the flat portion of the wire.

4. A contact probe, comprising
a support plate having a through hole;
a conductive contact element received in and retained by said through hole, said contact element having opposite first and second ends with the first end of said contact element protruding outwardly from said through hole to be brought in contact with a device to be tested;
a conductive signal-transmitting wire having a portion retained within said through hole to be in electric contact with the second end of said contact element for transmitting an electric signal received from said contact element to an outside circuit;
wherein
said portion of said signal-transmitting wire has an end portion in electric contact with the second end of said contact element, an enlarged middle portion contiguous to said end portion, and an output portion contiguous to said enlarged middle portion and protruding outwardly from said through hole to transmit the electric signal to the outside circuit; and
said enlarged middle portion has a cross sectional dimension larger than said end portion and said output portion.

5. The contact probe of claim 4, wherein said end portion has an end face in direct electric contact with the second end of said contact element, said end face having a circular shape.

6. The contact probe of claim 4 wherein said through hole has an opening through which said output portion extends, said opening is smaller in size than said enlarged middle portion so as to prevent extraction of said enlarged middle portion from said through hole.

7. The contact probe of claim 4, wherein said enlarged middle portion contacts and is motionlessly retained by an internal wall of said through hole.

8. The contact probe of claim 4, wherein said enlarged middle portion is fixed by adhesive to an internal wall of said through hole.

9. The contact probe of claim 4, wherein said portion of said signal-transmitting wire is substantially uniform in cross section except in said enlarged middle portion.

10. The contact probe of claim 9, wherein said enlarged middle portion has a plate-shaped cross section, said enlarged middle portion has two opposite planar surfaces and two opposite side surfaces curved towards an internal wall of said through hole.

11. The contact probe of claim 10, wherein said end portion and said output portion have a circular cross section of a diameter smaller than said cross sectional dimension of said enlarged middle portion, and the side surfaces of said enlarged middle portion extend beyond a cylindrical envelope defined by said end portion and said output portion.

12. The contact probe of claim 10, wherein said side surfaces of said enlarged middle portion are either in contact with the internal wall of said through hole or fixed to said internal wall by adhesive.

13. The contact probe of claim 4, further comprising a spring biasing the first end of said contact element outwardly from said through hole.

14. The contact probe of claim 13, wherein said spring defines the second end of said contact element.

15. The contact probe of claim 4, further comprising a spring biasing the second end of said contact element towards said end portion of said signal-transmitting wire.

16. The contact probe of claim 4, wherein said through hole has first and second sections each of a substantially uniform cross section, the first section has a first cross sectional dimension sufficient to accommodate the enlarged middle portion, the second section has a second cross sectional dimension sufficiently large to allow the output portion to pass through but smaller than the cross sectional dimension of said enlarged middle portion.

17. The contact probe of claim 16, wherein said support plate is a laminate of first and second layers, the first layer has the first section of said through hole and the second layer has the second section of said through hole.

18. The contact probe of claim 4, wherein the portion of said signal-transmitting wire that is received within said through hole is entirely made of conductive material.

* * * * *